United States Patent [19]
Arao et al.

[11] Patent Number: 5,800,632
[45] Date of Patent: Sep. 1, 1998

[54] PHOTOVOLTAIC DEVICE AND METHOD FOR MANUFACTURING IT

[75] Inventors: Kozo Arao; Katsumi Nakagawa; Yukiko Iwasaki, all of Nara, Japan

[73] Assignee: Canon Kabushiki Kaisha, Japan

[21] Appl. No.: 710,947

[22] Filed: Sep. 24, 1996

[30] Foreign Application Priority Data

Sep. 28, 1995 [JP] Japan .................. 7-250712
Sep. 28, 1995 [JP] Japan .................. 7-250713

[51] Int. Cl.$^6$ .................................. H01L 31/18
[52] U.S. Cl. .................. 136/258; 136/256; 136/259; 205/138; 205/141; 205/177; 205/182; 205/218; 205/320; 205/333; 438/62; 438/72
[58] Field of Search .................. 438/62, 72; 205/116, 205/138, 141, 177, 182, 218, 320, 333; 136/256, 258 AM, 259; 257/436

[56] References Cited

U.S. PATENT DOCUMENTS 4,551,575 11/1985 Takahashi et al. ............... 136/255
5,612,229 3/1997 Yoshida ............................. 438/72
5,668,050 9/1997 Iwasaki ............................. 438/69

OTHER PUBLICATIONS

R. D. Sharma et al, *J. Appl. Phys.*, vol. 58, Jul. 15, 1985, pp. 838–844.

"Electrochemically Synthesized ZnO Film" [Extended Abstracts, No. 2, p. 396, 20a–N–4 (The 55th Autumn Meeting, 1994); The Japan Society of Applied Physics].

*Primary Examiner*—Nam Nguyen
*Attorney, Agent, or Firm*—Fitzpatrick, Cella, Harper & Scinto

[57] ABSTRACT

A method for manufacturing a photovoltaic device comprising a metal layer, a first transparent conductive layer, a semiconductor layer, and a second transparent conductive layer sequentially stacked on a substrate comprising iron, comprises the steps of forming the metal layer by electro-deposition of the metal layer from a solution and forming the first transparent conductive layer by electro-deposition of the first transparent conductive layer from a solution.

34 Claims, 4 Drawing Sheets

PHOTOVOLTAIC DEVICE AND METHOD FOR MANUFACTURING IT

BACKGROUND OF THE INVENTION

1. Field of the Invention

The present invention relates to a method for manufacturing a photovoltaic device, and more specifically, to a method for manufacturing a photovoltaic device composed of a non-monocrystalline semiconductor material containing silicon or germanium atoms, e.g., hydrogenated amorphous silicon, hydrogenated amorphous silicon germanium, hydrogenated amorphous silicon carbide, microcrystalline silicon, polycrystalline silicon or the like, with an improved light reflecting layer.

2. Related Background Art

At present, the energy that mankind consumes depends upon steam power generation using a fossil fuel such as petroleum and coal and atomic power generation to a large extent. However, there are many problems in wholly relying in the future upon fossil fuels that cause warming of the earth due to carbon dioxide generated by the use thereof, or on atomic power that is accompanied by danger of radiation injury not only in an unforeseen disaster but also even during normal operation. Thus, attention has been focused on solar power generation using solar cells which exert an extremely small influence on the global environment and whose further use is expected.

As such a solar cell, a photovoltaic device has been employed which is composed of hydrogenated amorphous silicon, hydrogenated amorphous silicon germanium, hydrogenated amorphous silicon carbide, microcrystalline silicon, polycrystalline silicon, etc. In addition, to improve light collection in the long wavelength region, a reflecting layer is preferably provided on the back side of these devices. Such a reflecting layer is desired to have an effective reflecting characteristic in a wavelength region of small absorption near the band edge of a semiconductor material, i.e., in a region of 800 nm to 1200 nm. As materials fully satisfying this condition, for example, a metal layer comprising gold, silver, copper or the like is known. In addition, to prevent the deterioration of electrical characteristics due to shunting, the technique of providing a layer comprising a light transmissive material having electrical conductivity, i.e., a transparent conductive material, between the metal layer and a semiconductor layer is utilized. Generally the metal layer and the transparent conductive layer are formed on a base member, for example, by the vacuum deposition method or the sputtering method. The photovoltaic devices comprising such a metal layer or transparent conductive layer have an improved Jsc (Short Circuit Current: a current obtained by irradiation with solar rays while short circuiting the output electrodes of the solar cell. JSC increases with more effective use of solar energy) of 1 mA or more.

However, the aforesaid photovoltaic device has the following problems:

(1) The metal layer or transparent conductive layer formed by the vacuum deposition method or the sputtering method was sufficient in electric and optical characteristics but had a problem of being easily peeled off. For use in generating electricity outdoors over a long period, concern is raised for long-term reliability.

(2) Because of the steps involved in forming the metal layer or transparent conductive layer of the aforesaid photovoltaic device, the vacuum device may need a high repayment cost, and the utilization efficiency of the materials is insufficient. This substantially increases the cost of a photovoltaic device using the aforesaid technique, which is a large negative factor in the industrial application of solar cells. From the viewpoint of future non-polluting electricity generation as well as for the aforesaid reason, the cost reduction of photovoltaic devices is eagerly desired.

SUMMARY OF THE INVENTION

An object of the present invention in consideration of the above circumstances is to provide a method for enabling inexpensive and easy formation of a metal layer and a transparent layer with excellent adhesion to the layer in contact therewith and for enabling manufacturing of a high performance photovoltaic device comprising these layers.

The above-mentioned object of the present invention is achieved by a method for manufacturing a photovoltaic device comprising in sequence a metal layer, a first transparent conductive layer, a semiconductor layer, and a second transparent conductive layer stacked on a substrate containing at least iron, comprising the steps of:

forming the metal layer by electro-deposition from a solution; and forming the first transparent conductive layer by electro-deposition from another solution.

In addition, according to the present invention, a photovoltaic device, comprising, in sequence, a metal layer formed by electroplating, a first transparent conductive layer formed by electroplating, a semiconductor layer, and a second transparent conductive layer stacked on a substrate containing at least iron is provided.

DETAILED DESCRIPTION OF THE PREFERRED EMBODIMENTS

Figure 1:
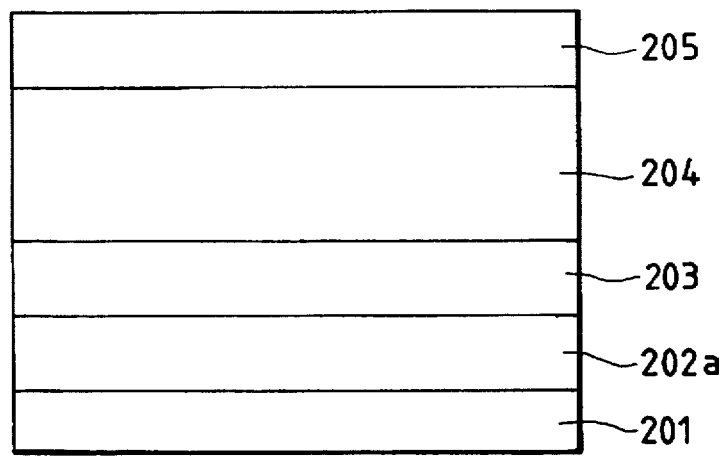
FIG. 1 is a sectional view schematically showing one example of the structure of a photovoltaic device manufactured according to the present invention.

The method of the present invention for manufacturing a photovoltaic device comprising in sequence a metal layer, a first transparent conductive layer, a semiconductor layer, and a second transparent conductive layer stacked on an iron-containing substrate is characterized in that the metal layer and the transparent layer are formed by electro-deposition of each material constituting the layer from a respective solution. In this manner, an expensive film forming apparatus required for the vacuum deposition method or the sputtering method becomes unnecessary and the respective layers can be formed stably and easily at low cost and at the same time a high performance photovoltaic device can be obtained.

According to the present invention, the surface of the substrate may be made uneven preferably by etching the iron-containing substrate with an acidic solution. As a result, by forming a metal layer and a first transparent conductive layer on the substrate in sequence by the above method, an uneven structure is given to these layers. Accordingly, since these layers can confine the reflected light within themselves, a further effective utilization of an incident light can be attained, thereby improving the characteristics of the photovoltaic device, especially the efficiency of light collection.

According to the present invention, in a photovoltaic device comprising such a metal layer preferably formed from copper, near IR light can be reflected by the metal layer without loss and a confinement effect is further promoted, thus bringing about an improvement in device characteristics.

In addition, in the present invention, the metal layer may be made in at least a two-layer stacked structure comprising a first metal layer and a second metal layer. In this case, a layer preferably comprising zinc and a layer comprising copper are formed as the first metal layer (preferably on the substrate side) and as the second metal layer (preferably on the semiconductor side). By the provision of such multilayer-structured metal layers, a photovoltaic device with excellent characteristics can be obtained in which near IR light can be reflected by the back reflecting layer without loss and optical confinement of the reflected light is further promoted.

According to the present invention, zinc oxide is preferably employed as the first transparent conductive layer. In a photovoltaic device comprising the first transparent conductive layer obtained in this manner, transmittance of near IR reflected light is good, crystal grains having a size on the order of the wavelength are formed and the scattered component of the reflected light can be greatly increased, so that an increase in the aforesaid $J_{sc}$ of the device becomes possible.

A photovoltaic device structure according to the present invention is applied, for example, to a solar cell, a sensor, an image pickup device etc., and further to uses in which, by connection of multiple devices in an array, a stable operation is obtained in outdoor environments for a long period of time, for example, to solar energy electricity generation for a house or other structure, or in a connection to a distribution system.

Hereinafter, embodiments according to the present invention will be described in more detail.

FIG. 1 shows one example of a photovoltaic device according to the present invention. The device shown in FIG. 1 has a structure comprising in sequence an iron-containing substrate 201, a metal layer 202a, a first transparent conductive layer 203 in contact with the metal layer 202a, a semiconductor layer 204 functioning to convert optical energy into electric energy, and a second transparent conductive layer 205.

Figure 2:
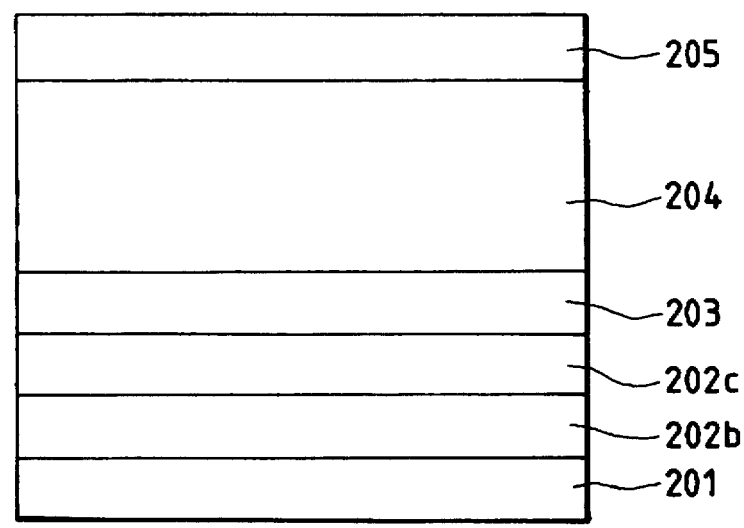
FIG. 2 is a sectional view schematically showing another example of the structure of a photovoltaic device manufactured according to the present invention.

FIG. 2 shows another example of a photovoltaic device according to the present invention. The device shown in FIG. 2 has a structure comprising in sequence an iron-containing substrate 201, a first metal layer 202b, a second metal layer 202c, a first transparent conductive layer 203 in contact with the second metal layer 202c, a semiconductor layer 204 functioning to convert optical energy into electric energy, and a second transparent conductive layer 205.

Next, methods according to the present invention will be described for the respective members constituting each of the above-mentioned photovoltaic devices as shown in FIG. 1 or 2.

First, an iron-containing substrate (e.g., 201 shown in FIGS. 1 and 2) is prepared. As the iron-containing substrate, preferably a sheet-shaped or foil-shaped substrate with its surface etched with an acidic solution such as hydrofluoric acid or nitric acid, is employed. And, as mentioned later, the substrate may be in the shape of a roll for the formation of layers thereon by means of a continuous treatment apparatus. To prevent the occurrence of rust at the edge, a nickel- or chrome containing stainless steel may be employed as a substrate material. The substrate is etched preferably with an acidic solution as mentioned above to form unevenness on the order of 1 μm. In this way, it becomes possible to confine the back reflected rays as mentioned above.

The iron-containing substrate is selected based upon its strength as a substrate, bending resistance, edge corrosion resistance, etc., but preferably contains carbon, silicon, magnesium, chromium, nickel, etc. Especially, ferrite group stainless steels containing nickel, martensite group stainless steels containing nickel and chrome, and other stainless steels are advantageous because of the lack of need for anticorrosive treatment.

In addition, from the standpoint of cost, a cold rolled steel sheet may be used. As for the shape, not only a steel sheet in roll form but a foil or sheet may be also used.

On the substrate, a metal layer (e.g., 202a shown in FIG. 1 or 202b and 202c shown in FIG. 2) is preferably formed by deposition of a metal for such a layer from a solution, preferably by electroplating. When the metal layer is a single layer, i.e., as the layer 202a shown in FIG. 1, the metal layer is formed by immersing the substrate in an aqueous solution containing copper ions, pyrophosphate ions, and nitrate ions and copper-plating the substrate with the substrate as the cathode.

Figure 3:
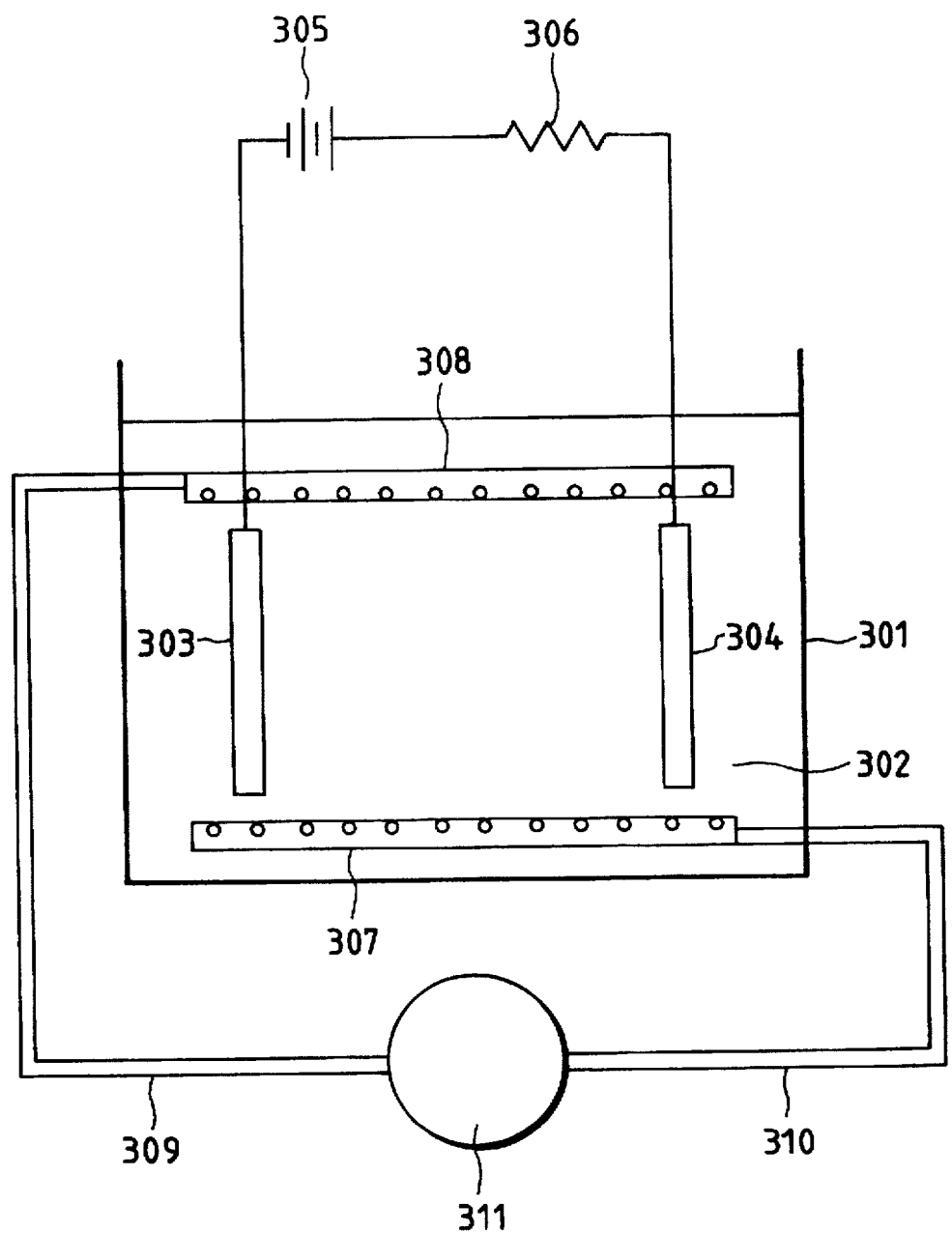
FIG. 3 is a sectional view schematically showing an example of an apparatus to be used in the present invention for forming a metal layer or a transparent conductive layer on the substrate.

More specifically, a metal layer can be formed, for example, in the apparatus shown in FIG. 3. In FIG. 3, Numeral 301 denotes a corrosion resistant vessel, in which a solution 302 comprising, for example, copper ions, pyrophosphate ions and nitrate ions is held. Numeral 303 denotes an iron-containing substrate, connected as a cathode in the present process.

Numeral 304 denotes a counter electrode. In this embodiment, copper is used as the counter electrode 304 which is an anode. The substrate 303 serving as a cathode and the counter electrode 304 serving as an anode are connected through a load resistor 306 to a power source 305 arranged as to supply a nearly constant current flow.

Further, to reduce a nonuniform deposition and increase the layer formation speed and thus improve the efficiency by stirring the solution in the vessel 301, a solution circulating system comprising a suction inlet member 308 having a plurality of solution inlet holes, an outlet member 307 having a plurality of solution outlet holes, a solution circulating pump 311, a suction solution pipe 309 connecting the solution suction inlet member 308 and the solution circulating pump 311, and a solution supply pipe 310 connecting the solution outlet member 307 and the solution circulating pump 311 is employed. As the suction inlet member 308 and the outlet member 307, a tube having a plurality of openings can be used as shown in FIG. 3. By using such an apparatus, the electrolysis of a solution is performed to deposit a metal (e.g., copper) on the substrate 303.

With respect to the solution 302 in the present process, the pH is preferably adjusted to 8.0–9.0 and the temperature is preferably in the range of 20° C. to 60° C. The cathode current density is preferably set at 1–10 A/cm². On an iron-containing substrate 303, good layer formation generally cannot be obtained from a copper sulphate bath, but according to this method, a metal layer of sufficient adhesion is formed by making the surface of the substrate 303 uneven, e.g., through etching. In addition, the above-mentioned method involves no great problem in disposal of waste fluid such as alkali cyanide baths and needs no strike bath.

A single metal layer can be formed by, e.g., using a silver cyanide bath or a gold cyanide bath according to the above method and plating the substrate with gold, silver, or a gold-silver alloy other than copper. In this case, the pH value of the solution is preferably adjusted to 3 to 13, the temperature is preferably set in the range of 30° C. to 80° C., and the current density is set in the range of 3 to 200 mA/cm².

On the other hand, in cases where the metal layer of the photovoltaic device is made of a two-layer structure comprising a first metal layer and a second metal layer (e.g., layers 202b and 202c shown in FIG. 2), the first metal layer (layer 202b) is formed by immersing the substrate, for example, in an aqueous solution containing sulfate ions and zinc ions or an aqueous solution containing chlorine ions, zinc ions and ammonia and zinc-plating the substrate connected as a cathode.

More specifically, for example, by using the apparatus shown in FIG. 3, a two layer metal layer can be formed similarly to the single metal layer mentioned above. Especially, in this case, an acid-proof vessel is employed as the corrosion resistant vessel 301, either an aqueous solution containing sulfate ions and zinc ions or an aqueous solution containing chlorine ions, zinc ions, and ammonia is used as the aqueous solution 302. The iron-containing substrate 303 is connected as the cathode also in this process.

As the counter electrode 304, a zinc rod is employed in this example. Similarly, the counter electrode 304 is connected as the anode, the substrate 303 serving as a cathode and the counter electrode 304 serving as an anode are connected through a load resistor 306 to the power source 305 and are supplied with a nearly constant current.

Also in this example, to reduce nonuniform deposition and raise the layer formation speed to improve the efficiency by stirring a solution in the apparatus shown in FIG. 3, a solution circulating system as described above is employed.

In the formation of such a first metal layer, the solution 302 is so adjusted that the pH value is preferably in the range of 1.5–4.5 for an aqueous solution containing sulfate ions and zinc ions or preferably in the range of 4.0–7.0 for an aqueous solution containing chlorine ions, zinc ions, and ammonia. The temperature is preferably in the range of 10° C. to 70° C. for an aqueous solution containing sulphate ions and zinc ions or preferably in the range of 10° C. to 40° C. for an aqueous solution containing chlorine ions, zinc ions, and ammonia. And, the cathode current density is preferably set at 2–80 A/cm² for an aqueous solution containing sulfate ions and zinc ions or preferably at 0.05–20 A/cm² for an aqueous solution containing chlorine ions, zinc ions, and ammonia.

The first metal layer can be formed by plating the substrate with tin or nickel, besides the zinc according to the above method. In the formation of a tin layer, a solution mainly comprising tin sulfate (about 40 g/liter) and sulfuric acid (about 100 g/liter) is preferably used, the current density is set in the range of 0.1–20 mA/cm² at room temperature and electroplating is performed. For the formation of the nickel layer, a Watts bath, i.e., an acidic bath (i.e., mixture bath of nickel sulfate, nickel chloride and boric acid) is used.

The second metal layer (layer 202c shown in FIG. 2) is formed by immersing the substrate, for example, in an aqueous solution containing sulfate ions and copper ions and by copper-plating the substrate connected as the cathode. Similarly to the single metal layer and the first metal layer mentioned above, the second metal layer can be formed in the apparatus shown in FIG. 3. In the corrosion resistant vessel 301, a solution 302 comprising sulfate ions and copper ion is provided. As the counter electrode 304, copper is employed. The stirring of the solution is carried out by using a circulation pump as described above. In this case, the temperature of the solution 302 comprising sulfate ions and zinc ions is preferably in the range of 10° C. to 70° C., whereas the cathode current density is set at 0.05–20 A/cm².

The second metal layer can be formed by, e.g., using a silver cyanide bath or a gold cyanide bath according to the above method and plating the substrate with gold, silver or a gold-silver alloy, besides copper. In this case, the pH value of the solution is preferably adjusted to 3 to 13, the temperature is preferably set in the range of 30° C. to 80° C., and the current density is set in the range of 3 to 200 mA/cm².

Next, on the metal layer (layer 202a shown in FIG. 1 or layer 202c shown in FIG. 2), a first transparent conductive layer (layer 203 shown in FIG. 1 or 2) is formed by electro-deposition of a material for the conductive layer from a solution. The first transparent conductive layer is formed by immersing a substrate, on which a single metal layer or first and second metal layers are formed, for example, into an aqueous solution containing zinc ions and nitrate ions and by depositing zinc oxide on the metal layer with the substrate connected as a cathode 303 in the apparatus shown in FIG. 3. For the counter electrode 304 serving as an anode, zinc is employed.

In the formation process of such a transparent conductive layer, the solution 302 is adjusted so that the pH is preferably in the range of 4.0–6.3 and the temperature is preferably in the range of 40° C. to 70° C. The cathode current density is set at 0.002–10 A/cm², especially preferably 0.01–2 A/cm². To stabilize the pH, acetic acid or nitric acid may be added to the solution. As additives for further stabilizing the pH, benzoic acid, formic acid, citric acid, glycolic acid, succinic acid, oxalic acid or the like is employed as circumstances demand.

The etching of a substrate (substrate 201 shown in FIG. 1 or 2), the formation of a metal layer (layer 202a shown in FIG. 1 or layers 202b and 202c shown in FIG. 2) and the formation of a transparent conductive layer (layer 204 shown in FIG. 1 or 2), each of which is a solution process (e.g., aqueous solution), can be continuously performed via intermediate water washing/rinsing steps. When a semiconductor layer 204 (shown in FIG. 1 or 2) as an overlying layer is formed by a vacuum process that cannot tolerate moisture, a drying step is performed after the formation of the first transparent conductive layer. For drying, an IR heating drying in the atmosphere, a warm air drying with heated oxygen, a vacuum drying, etc., can be employed.

The formation of the single metal layer or the first and the second metal layers and the first transparent conductive layer is characterized in that the solution can be maintained at an acidic pH throughout all the solution plating steps. Accordingly, during the water washing/rinsing steps and in the transportation of the substrate to the next step, the deterioration of a bath due to liquid contamination can be minimized. In addition, the path of the substrate in the washing/rinsing water in the intermediate steps can be shortened, so that there is a great advantage in the arrangement of manufacturing equipment.

Figure 4:
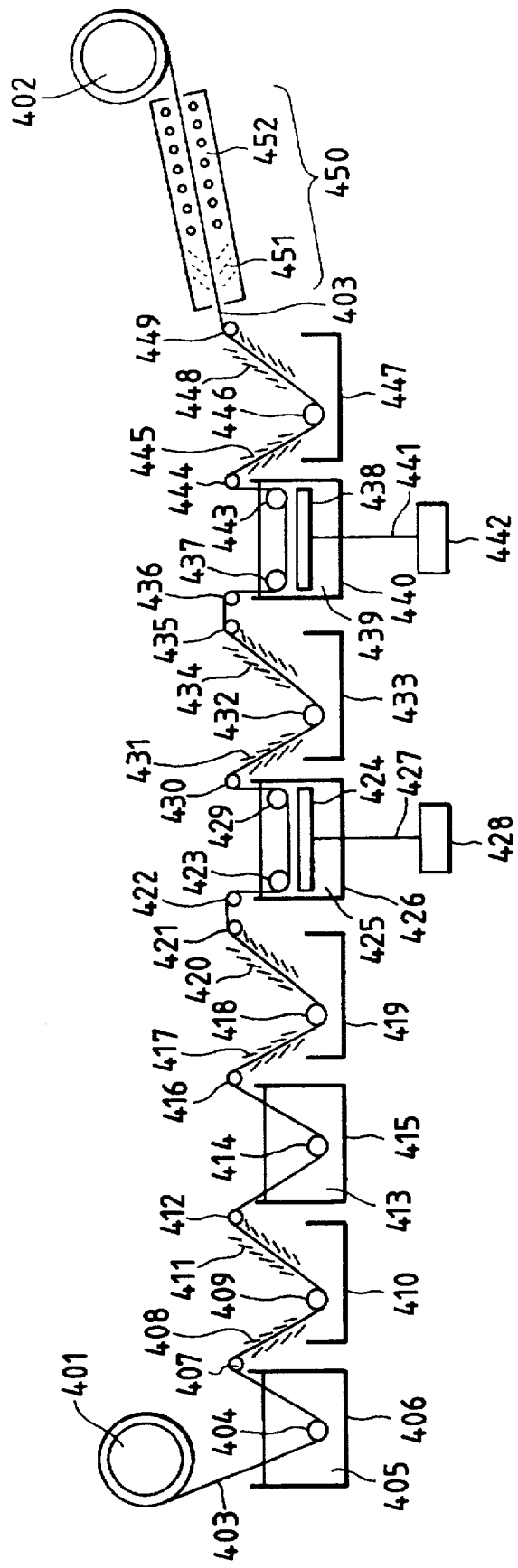
FIG. 4 is a sectional view schematically showing an example of an apparatus to be used in the present invention for continuously forming a metal layer or a transparent conductive layer on the substrate to be used in the present invention.

Referring to FIG. 4, one example of apparatus and process for continuously forming on a belt-like substrate a metal layer (single layer) and a first transparent conductive layer in the structure of the device shown in FIG. 1 will be described.

In the apparatus shown in FIG. 4, an elongated belt-like substrate 403 is supplied from a supply roller 401 and finally wound up on a takeup roller 402. Between the supply roller 401 and the takeup roller 402, a degreasing bath 406, a water rinsing bath 410, an etching bath 415, a water rinsing bath 419, a metal layer forming bath 426, a water rinsing bath 433, a transparent conductive layer forming bath 440, a water rinsing bath 447, and a drying furnace 450 are provided in sequence. In the respective baths, rollers 404, 409, 414, 418, 423, 429, 432, 437, 443, and 446 for controlling the conveying path of the substrate are provided.

In the apparatus shown in FIG. 4, after being degreased and water-rinsed in baths 406 and 410, respectively, the substrate 403 delivered from the roller 401 is etched with an acidic solution in bath 415 and rinsed with water in bath 419, then a metal is electro-deposited from a solution to form a metal layer (layer 202a shown in FIG. 1) on the substrate 403. Subsequently, after the substrate 403 with the metal layer formed thereon is rinsed with water in bath 433, a transparent conductive material is deposited from the solution in bath 440 to form a transparent conductive layer (layer 203 shown in FIG. 1) on the metal layer. Then, after water-rinsing in bath 447 and drying in furnace 450, the substrate 403 having the metal layer and the transparent conductive layer thereon is wound on the takeup roller 402.

Furthermore, referring to FIG. 5, an example of an apparatus and process for continuously forming on a belt-like substrate a first metal layer, a second metal layer, and a transparent conductive layer, for example, in the structure of the device shown in FIG. 2 will be described.

Figure 5:
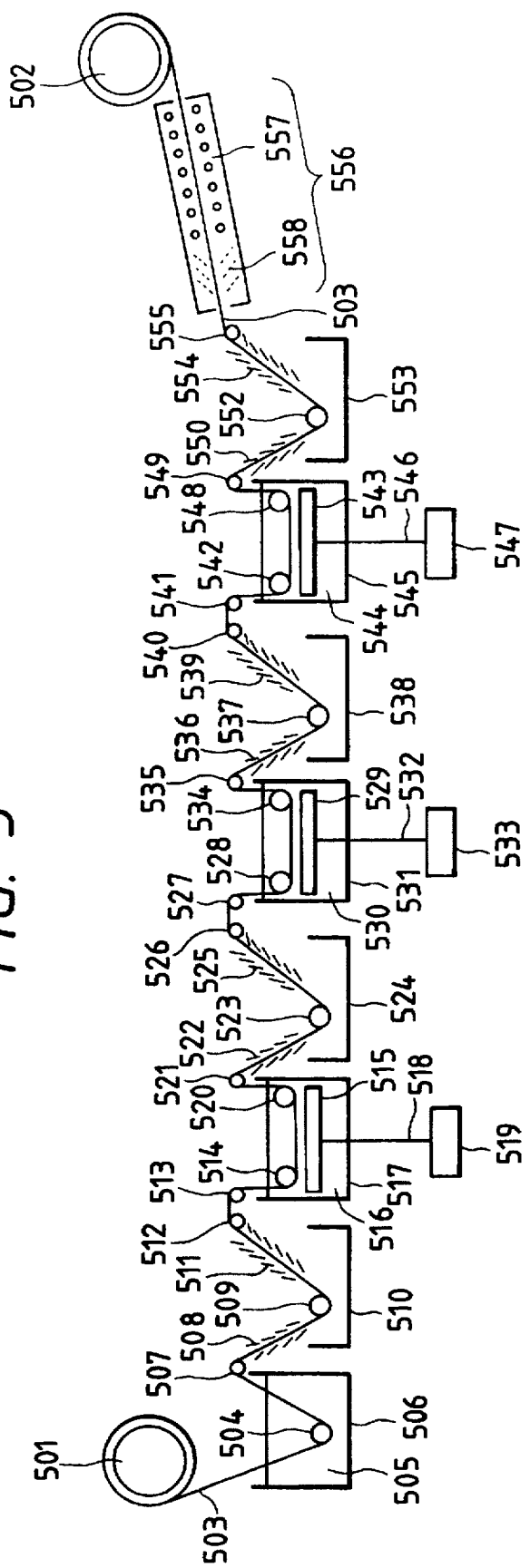
FIG. 5 is a sectional view schematically showing the outline of another example of apparatus to be used in the present invention for continuously forming a metal layer or a transparent conductive layer on the substrate.

In the apparatus shown in FIG. 5, a substrate roll 503 is supplied by a supply roller 501 and finally wound on a takeup roller 502. Between the supply roller 501 and the takeup roller 502, an etching bath 506, a water rinsing bath 510, a first metal layer forming bath 517, a water rinsing bath 524, a second metal layer forming bath 531, a water rinsing bath 538, a transparent conductive layer forming bath 545, a water rinsing bath 553, and a drying furnace 556 are provided in sequence. In the respective baths, rollers 504, 509, 514, 520, 523, 528, 534, 537, 542, 548 and 552 for controlling the conveying path of the substrate are provided.

In the apparatus shown in FIG. 5, the substrate 503 delivered from the roller 501 and etched with an acidic solution in the bath 506 and rinsed with water in the baths 510, and a metal is electro-deposited from a solution to form a first metal layer (layer 202b shown in FIG. 2) on the substrate 503. Next, after water rinsing in the bath 531, another metal is deposited from another solution to form a second metal layer (layer 202c shown in FIG. 2) on the substrate 503. Subsequently, after the substrate 503 with the first and the second metal layers formed thereon is rinsed with water in the bath 538, a transparent conductive material is deposited from a solution in the bath 545 to form a transparent conductive layer (layer 203 shown in FIG. 2) on the metal layer. Then, after rinsing with water in the bath 553 and drying in the furnace 556, the substrate 503 having the metal layers and the transparent conductive layer thereon is wound up on the takeup roller 502.

On a substrate provided with the metal layer (or first and second metal layers) and the transparent conductive layer, a predetermined treatment is then conducted to form a semiconductor layer (layer 204 shown in FIG. 1 or 2) on the transparent conductive layer.

The semiconductor layer 204 according to the present invention comprises at least one of a pn junction, pin junction, Schottky junction, and heterojunction, across which an electromotive force is generated in response to absorption of incident light. The current due to the generated electromotive force flows through the current path composed of the second transparent conductive layer (layer 205 shown in FIG. 1 or 2) formed as the upper layer, the first transparent conductive layer (layer 203 shown in FIG. 1 or 2) formed as the lower layer, the substrate 201 connected via the metal layer 202a or via the first and the second metal layers 202b and 202c, and the load coupled with them. The second transparent conductive layer formed as the upper layer is restricted in film thickness and may not have substantial current carrying capacity because of its role as an antireflection layer, at which time a grid electrode is further provided thereon.

By using the CVD method in which a gas is excited under influence of LF discharge, RF discharge, VHF discharge, or microwave discharge, a semiconductor layer can be obtained having a pn junction, pin junction, Schottky junction, or heterojunction and comprising amorphous or crystalline silicon, amorphous or crystalline silicon/germanium, amorphous or crystalline silicon carbide or the like, and as a multilayered structure known as tandem or triple junction.

Next, on the semiconductor layer, a second transparent conductive layer (layer 206 shown in FIG. 1 or 2) is formed by the vacuum deposition method, the sputtering method, the reactive sputtering method, or the CVD method. As materials for such a transparent conductive layer, ITO, $In_2O_3$, $SnO_2$, $ZnO$ and $TiO_2$, for example, can be employed. Such layers may also be employed in a stacked state.

Next, the function of a photovoltaic device obtained in the present invention will be described referring to the devices of structures shown in FIGS. 1 and 2.

The light incident the upper layer of the photovoltaic device is subjected to antireflection conditions at a certain central wavelength in the second transparent conductive layer 205, enters the semiconductor layer 204 and generates photocarriers in the semiconductor layer 204. Corresponding to their charge type, the generated photocarriers are collected at the side of the second transparent conductive layer 205 or at the first transparent conductive layer 203 and the metal layer 202a or the second and the first metal layers 202c and 202b and flow to the side of the substrate 201. The light not absorbed by the semiconductor layer 204 passes through the first transparent conductive layer 203, is reflected from the metal layer 202a or the second metal layer 202c, and passes back through the first transparent conductive layer 203 and returns to the semiconductor layer 204. For that reason, the reflectivity of the metal layer 202a in the structure shown in FIG. 1 or that of the second metal layer 202c in the structure shown in FIG. 2 is very important.

Since a light with longer wavelengths than that of the band edge of the semiconductor layer 204 are hardly absorbed by the semiconductor layer 204 even when returned to the semiconductor layer 204 by the reflection, it is important that the reflectivity of the metal layer 202a or the second metal layer 202c is superior near the absorption edge of the semiconductor layer 204.

In addition, when the metal layer 202a or the second metal layer 202c has unevenness or the first transparent conductive layer 203 has unevenness, a ray of light rebounding by reflection from the metal the layer 202a or the second metal layer 202c or by refraction in the first transparent conductive layer 203 travels obliquely and covers a large optical path, so that the quantity of light absorbed by the semiconductor layer 204 due to an effect usually called light confinement can be increased, resulting in an increase in photocurrent. This unevenness is preferably on the order of the wavelength at the absorption edge of the semiconductor layer 204.

In the present invention, the unevenness of the metal layer 202a, or the first and the second metal layers 202b and 202c, and the first transparent conductive layer 203 is obtained by etching the substrate 201, by subsequent formation of unevenness when a metal layer 202a or a first metal layer 202b and/or a second metal layer 202c is (are) formed, and further when the transparent conductive layer is formed. The result is an increase in the current of a photovoltaic device because the unevenness formed in the interface between the metal layer 202a or the second metal layer 202c and the first transparent conductive layer 203 and the unevenness formed between the first transparent conductive layer 203 and the semiconductor layer 204 are different rather than similar in shape.

On the other hand, for the photovoltaic device, a long-term stable operation is desired in an outdoors environment. For this reason, a sufficient durability against mechanical bending is required depending on the temperature, the humidity, and the conditions of installation. Because it is placed in the sunshine, a photovoltaic device must be adaptable to a wide range of temperatures from a high temperature near 100° C. in the daytime of summer to a low temperature of −30° C. or less at dawn in the winter. Furthermore, since a change of tens of degrees Celsius takes place during a diurnal cycle and the respective layers 202–205 stacked on the substrate 201 have different thermal coefficients, peeling often occurs in the interfaces. When the film thickness is larger, this trouble especially becomes significant.

The semiconductor layer 204 composed of amorphous silicon or amorphous silicon/germanium is on the order of several hundreds of nm in thickness, the second transparent conductive layer 205 is around 60 nm thick, the first transparent conductive layer 203 is around 1 μm thick, and the metal layer 202a or the second metal layer 203c is 200–500 nm thick. Peeling is observed first between the first transparent conductive layer 203 and the metal layer 202a or the second metal layer 203c and secondly between the metal layer 202a or the second metal layer 203c and the substrate 201.

Such peeling is prevented by cleaning the surface of an underlying layer before film formation, forming unevenness on the underlying surface to enlarge the surface area and promote good adhesion, dividing the interface into small regions so that the thermal expansion or contraction does not spread over the whole layer, and other means.

As a method according to the present invention, for example, the iron-containing substrate is etched with a hot aqueous solution containing hydrofluoric acid and nitric acid to make the surface into an uneven surface as mentioned above. In addition, a metal layer 202a or a first metal layer 202b and/or a second metal layer 202c is deposited on it to make the surfaces uneven. Furthermore, a first transparent conductive layer 203 is deposited on it to grow into crystal grains of size on the order of the wavelength of light such that the spaces between the crystal grains is filled with a different phase, so that the thermal expansion or contraction does not extend over the whole layer. This is important also when the substrate is bent under application of a physical force and is advantageous especially when manufacturing a very elastic photovoltaic device with the substrate being flexible.

In addition, especially in the film formation of a metal layer 202a or a second metal layer 202c and a first transparent conductive layer 203 according to the present invention, a temperature as high as several hundreds of degrees Celsius is not required to obtain the needed unevenness and a great thermal shock is not applied naturally.

According to experiments by the inventors, it is found that the repetition of temperature cycles in a humid environment leads to the occurrence of cracks in the first transparent conductive layer 203 and these cracks become paths for penetration of water, and that, in a module comprising a series connection of several photovoltaic devices as submodules, a reverse voltage is applied to the photovoltaic device during partial shading when only a portion is shaded, and consequently the metal forming the metal layer 202a or the second metal layer 202c generates a branching growth based on an electrochemical migration, thereby causing electrical shunting of the device.

In cases where the first transparent conductive layer 203 is formed minutely and rigidly over the whole layer, these phenomena occur and become noticeable especially when it is formed by a high-temperature vacuum process such as sputtering. Such electrical shunting of the device due to the branching growth are not recovered from thereafter even when the ambient humidity is lowered and the moisture is lost. Since the first transparent conductive layer 203 obtained by a method according to the present invention grows originally from an aqueous solution to form a layer, the relaxation to water acts and the problems mentioned above can be minimized.

Hereinafter, the present invention will be described in further detail using Examples, but the present invention is not limited to these Examples.

EXAMPLE 1

In this Example, a photovoltaic device comprising the layer constitution shown in FIG. 1 was manufactured by forming a metal layer, a first transparent conductive layer, a semiconductor layer, and a second transparent conductive layer in sequence on a substrate by using the aforesaid apparatus shown in FIG. 4. As the substrate, a thin plate of stainless steel 430A formed in a roll shape was used.

In the equipment shown in FIG. 4, the movement speed of the substrate roll was set at 20 cm/min. The tension applied to the substrate 403 was set at 10 kg and was controlled by using a tension control clutch (not shown), incorporated into a takeup roller 402.

Hereinafter, the description will proceed following the sequence of steps.

(1-1) The substrate 403 previously subjected to rust-preventive treatment was soaked in the degreasing bath 406 to remove the oil content. The degreasing bath liquid 405 was an aqueous solution comprising a mixture of 60 ml of sulfuric acid and 70 ml of hydrochloric acid (37% aqueous hydrogen chloride). The temperature was set at room temperature.

(1-2) The substrate 403 after the completion of step (1-1) was conveyed via the conveyance roller 407 to the water rinsing bath 410. By using rinsing showers 408 and 411, water rinsing was sufficiently accomplished. The rate of flow of rinse water is preferably at least 2 liter/min.

(1-3) The substrate 403 after the completion of step (1-2) was conveyed via the conveyance roller 412 to the acidic etching bath 415 and etching of the degreased substrate 403 was performed. The acidic etching bath liquid was made by mixing 3 parts of hydrofluoric acid (46% aqueous hydrogen fluoride water; used similarly hereinafter), 1 part of acetic acid, and 5 parts of nitric acid, and the liquid temperature was made equal to room temperatures.

(1-4) The substrate roll 403 after the completion of step (1-3) was conveyed to the water rinsing bath 419 similar to the rinsing bath after the degreasing. Since the metal layer forming bath liquid in the next step is alkaline, a weakly alkaline shower can be substituted for this water rinsing bath 419.

(1-5) The substrate roll 403 after the completion of step (1-4) was conveyed via the conveyance rollers 421 and 422 to the metal layer forming bath 426, and a metal layer (layer 202a shown in FIG. 1) comprising copper was formed on the etched substrate 403. The metal layer forming bath liquid was a solution of 80 g of copper pyrophosphate, 300 g of potassium pyrophosphate, 6 ml of aqueous ammonia (sp.gr. 0.88) and 10 g of potassium nitrate, made up with 1 liter of water, and the bath temperature was controlled to 50° C. to 60° C. The pH of the liquid was set in the range of 8.2–8.8.

For the anode, a copper sheet was employed. In this equipment, because the substrate 403 was at ground potential, the formation of a film was controlled by controlling the current on the copper sheet of the node. In this Example, the current density was set at 3 A/cm². The layer formation speed was 6 nm/s and the metal layer formed in the metal forming bath was 400 nm thick.

(1-6) The substrate roll 403 after the completion of step (1-5) was rinsed in the water rinsing bath 433. Then, the substrate 403 was conveyed via the conveyance rollers 435 and 436 to the transparent conductive layer forming bath 440, and a transparent conductive layer (203 shown in FIG. 1) comprising zinc oxide was formed on the metal layer. The transparent conductive layer forming bath liquid 439 was a solution of 30 g of zinc nitrate hexahydrate and 10 ml of nitric acid, made up with 1 liter of water and the bath temperature was maintained at 60° C. The pH of the liquid was set at 5.2–5.8. As the counter electrode, zinc with its surface subjected to buffing was employed. The current density flowing through the counter electrode was set at 2 A/cm². The layer forming speed was 18 nm/s and the first transparent conductive layer 408 formed in the first transparent conductive layer forming bath was 1 μm thick.

(1-7) The substrate 403 after the completion of the step (1-6) was rinsed in the water rinsing bath 447. Then, the substrate roll 403 was conveyed via the conveyance rollers 449 to the drying furnace 450. The drying furnace 450 comprises a warm air nozzle 451 and an IR heater 452, and water removal was also performed simultaneously in the warm air nozzle 451. The temperature of the warm air in the warm air nozzle 451 was set at 150° C. and that of the IR heater 452 was set at 200° C.

(1-8) The substrate 403 through the drying step of the step (1-7) was wound on the takeup roller 402. In this manner, a base member for the device shown in FIG. 1 was obtained in which a metal layer 202 and a first transparent conductive layer 203 were formed on the iron-containing substrate 201.

In the aforesaid metal layer forming bath 426 and transparent conductive layer forming bath 440, air stirring and mechanical stirring were employed, respectively. For both baths, the pH of the bath liquid was continuously monitored with a pH meter incorporating temperature correction and using a glass electrode. By addition of ammonia to the metal layer forming bath 426 and addition of nitric acid to the transparent conductive bath 440, the pH of the respective baths was controlled.

(1-9) On the base member formed by steps 1) to (1-8), i.e., with a metal layer 202 and a first transparent conductive layer 203 sequentially stacked on the substrate 201, a triple-structured semiconductor layer 204 comprising three sets of p-i-n structures was formed in a CVD apparatus using the belt-like substrate wound in the shape of a roll.

(1-10) By using a gas mixture of silane, phosphine, and hydrogen and heating the substrate at 340° C., 400 W of RF power was applied to form an n-type layer. Next, by using a gas mixture of silane and germanium hydride and setting the substrate temperature at 450° C., microwave power was applied to form an i-type layer. Furthermore, by setting the substrate temperature at 250° C., a p-type layer was formed from a gas mixture of boron trifluoride, silane, and hydrogen to form a bottom pin layer.

(1-11) Except that the mixing ratio of silane and germanium was increased in forming the i-type layer, a middle p-i-n layer was formed similarly to step (1-10).

(1-12) Except that a mixture ratio of silane and hydrogen was employed in forming the i-type layer, a top p-i-n layer was formed similarly to step (1-10).

(1-13) On the semiconductor layer 204 formed by steps (1-9) to (1-12), a second transparent conductive layer 205 comprising ITO was deposited. As the deposition apparatus, a sputtering apparatus accommodating a belt-like substrate wound in the shape of a roll was employed similarly to the apparatus use in the formation of the semiconductor layer.

(1-14) By using silver paste, electrode printing treatment was performed to obtain a photovoltaic device of the structure shown in FIG. 1.

For purposes of comparison, a photovoltaic device of the structure shown in FIG. 1 was obtained of design similar to that described above except that both a metal layer comprising copper and a transparent conductive layer comprising zinc oxide were formed by the sputtering method.

The layer formation by sputtering was performed by using a parallel plate plate type DC magnetron sputtering apparatus, a ZnO sintered target for the ZnO layer, a metal target for the metal layer, and argon gas under the conditions of 1.2 Pa and discharge power: 2.5 W/cm². The substrate temperature for formation of the ZnO layer was set at 200° C., and the substrate temperature for formation of the metal layer was set at room temperature (without heating).

On the photovoltaic device manufactured by the aforesaid steps (1-1) to (1-14) and the photovoltaic device with the layers comprising copper and zinc oxide, formed by the sputtering method, photoelectric conversion characteristics were examined by irradiation of a simulator lamp.

Specifically, as the simulator lamp, a usual illumination type xenon lamp spectrum-corrected by a filter was employed. Its spectrum was set at AM1.5 and the amount of light illumination on a sample-mounting table was set at 100 mW/cm$^2$. Sample temperature was maintained at 25° C. by water-cooling the sample table. While under the simulator lamp, current-voltage characteristics were measured by scanning the voltage applied to the photovoltaic device. The maximum value of the product of current and voltage in the obtained current-voltage characteristics curve is the maximum power. Energy conversion efficiency was calculated by dividing this value by the amount of incident light (area-corrected).

The comparative study revealed that the photovoltaic device manufactured by the aforesaid steps (1-1) to (1-14) has 1.1 times the energy conversion efficiency of the photovoltaic device with copper and zinc oxide deposited on a stainless steel substrate by the sputtering method.

Next, the aforesaid two types of photovoltaic devices were placed in an environmental test box of 85° C./85% RH and after a lapse of time, photoelectric conversion characteristic were monitored with 1V of reverse bias applied.

As a result, the photovoltaic device with copper and zinc oxide deposited on a stainless steel substrate by the sputtering method approached the shunting level of a disabled state in 10 minutes and became unusable in one hour. In contrast to this, the photovoltaic device manufactured by the aforesaid steps (1-1) to (1-14) could maintain a usable shunting level state during a period of 15 hours.

In Example 1, as the metal layer forming bath liquid 425, an aqueous solution comprising 80 g of copper pyrophosphate, 300 g of potassium pyrophosphate, 6 ml of aqueous ammonia (sp.gr. 0.88) and 10 g of potassium nitrate dissolved in 1 liter of water was chosen, but the quantities used may be in the range of 60–110 g for copper pyrophosphate, 100–500 g for potassium pyrophosphate, 1–10 ml for aqueous ammonia, and 5–20 g for potassium nitrate. Potassium pyrophosphate contributes to the unevenness of the formed copper film and a large amount of it inhibits formation of the unevenness. In addition, when an excess of it is present in the bath liquid, generation of orthophosphoric acid occurs, thus leading to a decrease in current density. A smaller amount of potassium nitrate and aqueous ammonia increase the unevenness. From the standpoint of good adhesion, a certain degree of their presence is preferable.

In Example 1, as the transparent conductive layer forming bath liquid 439, an aqueous solution comprising 30 g of zinc nitrate hexahydrate and 10 ml of nitric acid dissolved in 1 liter of water was chosen, but 1 g–80 g of zinc nitrate hexahydrate may be used, nitric acid is not added or may be added to an upper limit of 50 ml, and 3–20 ml of acetic acid may be added for the purpose of facilitating pH control. The unevenness of the formed film depends on the temperature and the film forming speed. When a film is formed slowly at a high temperature, a relatively flat film with good crystal orientation and close adhesion is obtained. When a film is formed rapidly at a low temperature, a highly uneven film is obtained. These conditions should be selected in accordance with the wavelength of light in which the light confinement effect is needed for the semiconductor layer 204.

Furthermore, in Example 1, an example where the semiconductor layer 204 was formed as a triple layer of p-i-n structure by the CVD method was shown, but methods other than CVD is applicable if they can form a semiconductor film at several hundreds of degrees Celsius. Materials to which the aforesaid photovoltaic device manufacturing method is applicable are, for example, ZnS, SnSe, crystalline silicon, and CuInSe.

EXAMPLE 2

In this Example, except that the temperature of each water rinsing bath was set at about 50° C., a metal layer and a transparent conductive layer were formed on a substrate in the structure shown in FIG. 1 in substantially the same manner as that of Example 1.

However, the etching bath liquid comprising a mixture of 3 parts of nitric acid, 2 parts of hydrofluoric acid, and 3 parts of acetic acid, the same metal layer forming bath liquid as in Example 1 and the transparent conductive layer forming bath liquid 439 comprising 30 g of zinc nitrate hexahydrate, 10 ml of nitric acid and 5 ml of acetic acid dissolved in 1 liter of water were employed. The current density was set to 2 A/cm$^2$ for the metal layer forming and 0.4 A/cm$^2$ for the transparent conductive layer forming 439. At that time, the layer forming speed and film thickness were set to 3 nm/s and 200 nm for the metal layer 202 and 1 nm/s and 1200 nm for the first transparent conductive layer 203.

On the first transparent conductive layer 203 obtained in this way, a triple-structured semiconductor layer 204 and a second transparent conductive layer 205 were formed in a manner similar to that of Example 1, to obtain a photovoltaic device of the structure shown in FIG. 1.

Photoelectric conversion characteristics of the photovoltaic device manufactured in Example 2, were examined by irradiating a simulator lamp. The measuring conditions were the same as those of Example 1.

As a result, it was revealed that the photovoltaic device manufactured in Example 2 had 1.06 times the energy conversion efficiency of that manufactured in Example 1 with copper and zinc oxide deposited on a stainless steel substrate by using a sputtering apparatus.

Next, the photovoltaic devices manufactured in this Example were placed in an environmental test box of 85° C./85% RH and after a lapse of time, the photoelectric conversion characteristics were monitored with 1V of reverse bias applied.

As a result, the photovoltaic devices manufactured in this Example could maintain a shunting level within a usable state during a period of 17 hours and exhibited excellent stability.

With the method of Example 2, since temperature is constant in all steps, the inconvenience of conditions changing from the set values can be avoided which would have occurred every time the substrate enters the respective bath. In addition, it is also possible to minimize the length of the whole apparatus. Thus, Example 2 can contribute to the cost reduction of a manufacturing apparatus, so that an inexpensive and simple photovoltaic device can be manufactured.

EXAMPLE 3

In this Example, by using a 1 mm thick and 5 cm square stainless steel plate 304 ground into a mirror plane as the substrate 201 and by using a plurality of apparatus shown in FIG. 3, a metal layer 202a and a first transparent conductive layer 203 were formed in a batch process.

The substrate was held by a clip made of stainless steel and at the same time this clip was employed as a current path when the substrate was connected as a cathode.

Water rinsing was performed by using two water containers of the same size shown in FIG. 3 for each water cleaning step.

By using an alkaline cleanser mainly comprising caustic soda employed as the degreasing bath liquid, degreasing was performed at 50° C. for 10 minutes.

With a 1:1 mixture of nitric acid and hydrofluoric acid employed as etching bath liquid, etching was performed at 25° C. for 3 minutes.

An aqueous solution comprising 80 g of copper pyrophosphate, 150 g of potassium pyrophosphate, 2 ml of ammonia water (sp.gr. 0.88) and 5 g of potassium nitrate dissolved in 1 liter of water was employed as the metal layer forming bath liquid, and a 150 nm thick metal layer 202a with unevenness was formed on the substrate 201 at a bath temperature of 25° C. and a cathode current density of 1 A/cm$^2$.

With an aqueous solution comprising 50 g of zinc nitrate hexahydrate and 20 ml of nitric acid dissolved in 1 liter of water employed as the transparent conductive layer forming bath liquid, a 500 nm thick first transparent conductive layer 203 was formed at a bath temperature of 62° C. and a cathode current density of 0.2 A/cm$^2$.

For each of the degreasing bath, etching bath, metal layer forming bath and transparent conductive layer forming bath, solution stirring was performed by using the bath circulating apparatus shown in FIG. 3. The formed first transparent conductive layer 203 exhibited a crystal structure of wurtzite type on the RHEED and crystal grains of 1 µm size in a SEM image. With other operations, conditions and design items similar to those of Example 1, a metal layer and a first transparent conductive layer were formed.

On the first transparent conductive layer 203 obtained in this way, a single pin-structured semiconductor layer 204 and a second transparent conductive layer 205 were formed in a manner similar to that of Example 1 to obtain a photovoltaic device of the structure shown in FIG. 1.

For comparison, except that a metal layer comprising copper and a transparent conductive layer comprising zinc oxide was formed on a stainless steel substrate by the sputtering method, a photovoltaic device of the structure shown in FIG. 1 was obtained in accordance with and design similar to those described above.

On the photovoltaic device manufactured in Example 3 and the photovoltaic device with copper and zinc oxide deposited on a stainless steel substrate by the sputtering method, photoelectric conversion characteristics were examined by irradiation of a simulator lamp. The measuring conditions were the same as in Example 1.

As a result, it was revealed that the photovoltaic device according to Example 3 with a metal layer and a first transparent conductive layer formed using the aforesaid apparatus shown in FIG. 3 had 1.2 times the energy conversion efficiency of that manufactured in Example 1 with copper and zinc oxide deposited on a stainless steel by using a sputtering apparatus. Thus, a photovoltaic device according to Example 3 was judged to have a large light confinement effect.

Next, the aforesaid two types of photovoltaic devices were placed in an environmental test box of 85° C./85% RH and after the lapse of time, photoelectric conversion characteristics were monitored with 1V of reverse bias applied.

As a result, the photovoltaic device with copper and zinc oxide deposited on a stainless steel substrate by the sputtering method approached the shunting level of a disabled state in 5 minutes and became unusable in 40 minutes. In contrast to this, the photovoltaic device manufactured in Example 3 with a metal layer and other layers formed using the apparatus shown in FIG. 3 could maintain a usable shunting level during a period of 10 hours.

With a method according to Example 3, the process times and bath temperatures are freely selectable as compared with the manufacturing process using a roll-type substrate and control of the current becomes possible by direct control of the cathode current. In addition, since various maintenance operations and inspections can be individually effected, a manufacturing process with a high degree of freedom can be constructed.

EXAMPLE 4

In this Example, with the aid of the equipment shown in FIG. 5, a photovoltaic device comprising the layer constitution shown in FIG. 2 was manufactured by forming a semiconductor layer and a second transparent conductive layer after a first metal layer, a second metal layer, and a first transparent conductive layer were formed on a substrate.

In the apparatus shown in FIG. 5, the movement speed of the substrate roll 503 was set at 20 cm/minute. The tension applied to the substrate roll 503 was set to 10 kg and was controlled with the aid of a tension control clutch (not shown), built in the takeup roller 502.

Hereinafter, the manufacturing procedure will be described in accordance with the sequence of steps.

(4-1) The substrate 503 was allowed to pass through the acidic etching bath 506 and was etched with hydrofluoric acid and nitric acid. The acidic etching bath liquid was made by mixing 3 parts of hydrofluoric acid (46% aqueous hydrogen fluoride, 1 part of acetic acid, and 5 parts of nitric acid, and the bath temperature was set at room temperature.

(4-2) The substrate 503 after the completion of step (4-1) was conveyed via the conveyance roller 507 to the water rinsing bath 510. By using rinsing showers 508 and 511, water rinsing was sufficiently accomplished. At that time, the flow rate of water is preferably at least 2 liter/min.

(4-3) The substrate roll 503 after the completion of step (4-2) was conveyed via the conveyance rollers 512 and 513 to the first metal layer forming bath 517, and a first metal layer (layer 202b shown in FIG. 2) comprising zinc was formed on the etched substrate 503. The first metal layer forming bath liquid 516 was a mixture of 300 g of zinc sulfate and 30 g of ammonium sulfate, made up with 1 liter of water and the bath temperature was controlled to 50° C. to 60° C. The pH of the liquid was set in the range of 3.0–4.0.

For the anode, a zinc sheet was employed. In this apparatus, because the substrate 503 was at ground potential, film formation was controlled by controlling the current on the zinc anode sheet. In this Example, the current density was set at 30 A/cm$^2$. The layer formation speed was 5 nm/s and the first metal layer 502 formed in the first metal forming bath was 200 nm thick. Thereafter, the substrate 503 was conveyed via the conveyance roller 521 to the water rinsing bath 524. Water rinsing was sufficiently effected with the rinsing showers 522 and 525.

(4-4) The substrate 503 after the completion of step (4-3) was conveyed via the conveyance rollers 526 and 527 to the second metal layer forming bath 531, and a second metal layer (layer 202c shown in FIG. 2) comprising copper was formed on the first metal layer. The second metal layer forming bath liquid 530 was a mixture of 150 g of copper sulfate and 50 g of sulfuric acid, made up with 1 liter of water and the bath temperature was controlled to 20° C. to 25° C.

For the anode, a copper sheet was employed. The current density was set to 3 A/cm$^2$. In this manner, a second metal layer having a thickness of 300 nm was obtained.

(4-5) The substrate 503 after the completion of step (4-4) was rinsed in the water rinsing bath 538. Then, the substrate roll 503 was conveyed via the conveyance rollers 540 and 541 to the transparent conductive layer forming bath 545 and a first transparent conductive layer (203 shown in FIG. 2) comprising zinc oxide was formed on the second metal layer. The transparent conductive layer forming bath 544 was a solution of 30 g of zinc nitrate hexahydrate and 10 ml of nitric acid, made up with 1 liter of water and the bath temperature was maintained at 60° C. The pH of the liquid was set at 5.2–5.8. As the counter electrode, zinc with its surface subjected to buffing was employed. The current density flowing through the counter electrode was set at 2 A/cm$^2$. The layer forming speed was 18 nm/s and a first transparent conductive layer 204 formed in the first transparent conductive layer forming bath was 1 μm thick.

(4-6) The substrate roll 503 after the completion of step (4-5) was rinsed with water in the water rinsing bath 553. Then, the substrate 503 was conveyed via the conveyance rollers 555 to the drying furnace 556. The drying furnace 556 comprises a warm air nozzle 557 and an IR heater 558, and water removal was also performed simultaneously in the warm air nozzle 557. The temperature of warm air in the warm air nozzle 557 was set at 150° C. and that of the IR heater 558 was set at 200° C.

(4-7) The substrate roll 503 after the drying of step (4-6) was wound up by the takeup roller 502. In this manner, a base member for the device shown in FIG. 2 was obtained in which a first metal layer 202b, a second metal layer 202c, and a first transparent conductive layer 203 were formed on the iron-containing substrate 201.

In the aforesaid first and second metal layer forming baths 517 and 531 and transparent conductive layer forming bath 545, air stirring and mechanical stirring were employed, respectively. For all three baths, the pH of the bath liquid was continuously monitored with a pH meter incorporating temperature correction and using a glass electrode. By addition of zinc sulfate to the first metal layer forming bath 517, addition of copper sulfate and ammonia to the second metal layer forming bath 531, and addition of nitric acid to the transparent conductive bath 545, the pH of the respective baths was controlled.

(4-8) On the base member formed by steps (4-1) to (4-7), i.e., with a first metal layer 202b, a second metal layer 202c, and a transparent conductive layer 203 stacked in sequence on the substrate 201, a triple-structured semiconductor layer 204 was formed in a CVD apparatus applicable to a belt-like substrate wound in the shape of a roll in accordance with a method and conditions similar to those of steps (1-9) to (1-12).

(4-9) On the semiconductor layer 204 formed by step (4-8), a second transparent conductive layer 205 comprising ITO was deposited. As the deposition apparatus, a sputtering apparatus applicable to a belt-like substrate wound in the shape of a roll was employed similarly to the formation of the semiconductor layer.

(4-10) By using silver paste, electrode printing treatment was performed to obtain a photovoltaic device of the structure shown in FIG. 2.

For purposes of comparison, a photovoltaic device of the structure shown in FIG. 2 was obtained in accordance with the operations and design similar to those described above except that a first metal layer comprising zinc, a second metal layer comprising copper, and a first transparent conductive layer comprising zinc oxide were formed by the sputtering method.

On the photovoltaic device manufactured by the aforesaid steps (4-1) to (4-10) and the photovoltaic device with the metal layers and zinc oxide layer formed by the sputtering method, photoelectric conversion characteristics were examined by irradiation of a simulation lamp.

The comparative study revealed that the photovoltaic device manufactured by the aforesaid steps (4-1) to (4-10) had 1.12 times the energy conversion efficiency of the photovoltaic device with zinc, copper, and zinc oxide deposited on a stainless steel substrate by the sputtering method.

Next, the aforesaid two types of photovoltaic devices were placed in an environmental test box of 85° C./85% RH and after a lapse of time, photoelectric conversion characteristics were monitored with 1V of reverse bias applied.

As a result, the photovoltaic device with zinc, copper and zinc oxide deposited on the stainless steel substrate by the sputtering method approached a shunting level of a disabled state in 10 minutes and became unusable in one hour. In contrast to this, the photovoltaic device manufactured by the aforesaid steps (4-1) to (4-10) could maintain usable shunting level during a period of 15 hours.

In Example 4, as the first metal layer forming bath 516, an aqueous solution comprising 300 g of zinc sulfate and 30 g of ammonium sulfate, dissolved in 1 liter of water was chosen, but the quantities used may be in the range of 150–450 g for zinc sulfate and 5–50 g for ammonium sulfate. The other buffer solutions include magnesium sulfate, sodium sulfate, aluminum sulfate, sodium acetate, sodium chloride, and boric acid. These buffer solutions can be used in quantities of 1 g to 80 g.

In Example 4, as the transparent conductive layer forming bath 544, an aqueous solution comprising 30 g of zinc nitrate hexahydrate and 10 ml of nitric acid dissolved in 1 liter of water was chosen, but 1 g–80 g of zinc nitrate hexahydrate may be used, nitric acid is not added or may be added to the upper limit of 50 ml, and 3–20 ml of acetic acid may be added for the purpose of facilitating the control of pH. The unevenness of the formed film depends on the temperature and the film forming speed. When the film is formed slowly at a high temperature, a relatively flat film with good crystal orientation and good adhesion is obtained. When the film is formed rapidly at a low temperature, a highly uneven film is obtained. These conditions should be selected in accordance with the wavelength of light in which the light confinement effect is desired for the semiconductor layer 204.

Furthermore, in Example 4, an example where a triple layer of p-i-n structure was formed by the CVD method was shown as the semiconductor layer 204, but other methods than the CVD are applicable if they can form a film at several hundreds of degrees Celsius. Materials for the semiconductor layer 204 to which the aforesaid photovoltaic device manufacturing method is applicable are, for example, ZnS, SnSe, crystalline silicon, and CuInSe.

EXAMPLE 5

In this Example, except that the temperature for each water rinsing and for each bath was set to about 50° C., first and second metal layers and a first transparent conductive layer were formed on a substrate in accordance with the structure shown in FIG. 2 in substantially the same manner as in Example 4.

However, the etching bath liquid comprising a mixture of 3 parts of nitric acid, 2 parts of hydrofluoric acid, and 3 parts of acetic acid, the same first and second metal layer forming baths as in Example 4 and the transparent conductive layer forming bath comprising 30 g of zinc nitrate hexahydrate, 10 ml of nitric acid and 5 ml of acetic acid dissolved in 1 liter of water were employed. The current density was set to 2 A/cm$^2$ for the metal layer forming bath and 0.4 A/cm$^2$ for the transparent conductive layer forming bath. At that time, the layer forming speed and film thickness were respectively set to 7 nm/s and 100 nm for the first metal layer 202b; 5 nm/s and 200 nm respectively, for the second metal layer 202c; and 1 nm/s and 1200 nm respectively, for the first transparent conductive layer 203.

On the first transparent conductive layer 203 obtained in this way, a triple-structured semiconductor layer 204 and a second transparent conductive layer 205 were formed in a manner similar to that of Example 4, and a photovoltaic device of the structure shown in FIG. 2 was obtained.

On the photovoltaic device manufactured in Example 5, photoelectric conversion characteristics were examined by irradiating a simulator lamp. The measuring conditions were the same as in Example 1.

As a result, it was revealed that the photovoltaic device manufactured in Example 5 had 1.07 times the energy conversion efficiency of that manufactured for comparison in Example 4 with zinc, copper, zinc oxide deposited on a stainless steel substrate by using a sputtering apparatus.

Next, the photovoltaic devices manufactured in this Example was placed in an environmental test box at 85° C./85% RH and after a lapse of time, photoelectric conversion characteristics were monitored with 1V of reverse bias applied.

As a result, the photovoltaic device manufactured in this Example could maintain a shunting level of a usable state during a period of 17 hours and exhibited excellent stability.

With the method of Example 5, since the temperature is constant for all steps, the inconvenience of conditions changing from the set values which would have been effected every time the substrate roll enters the respective bath can be avoided. In addition, it is also possible to minimize the length of the whole apparatus. Thus, Example 2 can contribute to the cost reduction of a manufacturing apparatus, so that an inexpensive and simple photovoltaic device can be manufactured.

EXAMPLE 6

In this Example, by using a 1 mm thick and 5 cm square stainless steel plate 304 with a mirror ground planar surface as the substrate 201 and by using a plurality of electroplating tanks shown in FIG. 3, first and second metal layers 202b and 202c and a first transparent conductive layer 203 were formed in a batch process.

The substrate was held by a clip made of stainless steel and at the same time this clip was employed as a current path when the substrate used as a cathode.

Water rinsing was performed by using two water containers of the same size shown in FIG. 3 for each water rinsing step.

By using a 1:1 mixture of nitric acid and hydrofluoric acid employed as etching bath liquid, etching was performed at 25° C. for 3 minutes.

An aqueous solution comprising 200 g of zinc sulfate and 60 g of magnesium sulfate dissolved in 1 liter of water was employed as the first metal layer forming bath, a 150 nm thick uneven first metal layer 202b comprising zinc was formed on the substrate 201 at a bath temperature of 25° C. and a cathode current density of 20 A/cm$^2$.

An aqueous solution comprising 240 g of copper sulfate and 60 g of sulfuric acid dissolved in 1 liter of water was employed as the second metal layer forming bath liquid, and a 150 nm thick uneven second metal layer 202b comprising copper was formed on the substrate 201 at a bath temperature of 25° C. and a cathode current density of 2 A/cm$^2$.

With an aqueous solution comprising 50 g of zinc nitrate hexahydrate and 20 ml of nitric acid dissolved in 1 liter of water employed as the transparent conductive layer forming bath, a 500 nm thick first transparent conductive layer 203 comprising zinc oxide was formed at a bath temperature of 62° C. and a cathode current density of 0.2 A/cm$^2$.

For each of the etching bath, first metal layer forming bath, second metal layer forming bath, and transparent conductive layer forming bath, solution stirring was performed by using the bath circulating apparatus shown in FIG. 3. The formed first transparent conductive layer 203 indicated a crystal structure of wurtzite type via RHEED and crystal grains of 1 μm size in a SEM image. With other operations, conditions and design items similar to those of Example 4, first and second metal layers and a first transparent conductive layer were formed.

On the first transparent conductive layer 203 obtained in this way, a semiconductor layer 204 comprising a single pin structure containing silicon and germanium and a second transparent conductive layer 205 were formed by the CVD method similar to that of Example 4 and a photovoltaic device of the structure shown in FIG. 2 was obtained.

For comparison, except that a first metal layer comprising zinc, a second metal layer comprising copper, and a transparent conductive layer comprising zinc oxide was formed on a stainless steel substrate by the sputtering method, a photovoltaic device of the structure shown in FIG. 2 was obtained in accordance with an operation and design similar to those described above.

On the photovoltaic device manufactured in Example 6 and the photovoltaic device with zinc, copper, zinc oxide, etc. deposited on a stainless steel substrate by the sputtering method, photoelectric conversion characteristics were examined by irradiating a simulator lamp. The measuring conditions were the same as with Example 1.

As a result, it was revealed that the photovoltaic device manufactured in Example 6 with first and second metal layers and a first transparent conductive layer formed using the aforesaid apparatus of FIG. 3 had 1.17 times the energy conversion efficiency of the photovoltaic device with zinc, copper, and zinc oxide deposited on a stainless steel by the sputtering method. Thus, a photovoltaic device according to Example 6 was judged to have a large light confinement effect.

Next, the aforesaid two types of photovoltaic devices were placed in an environmental test box at 85° C./85% RH and after the lapse of time, photoelectric conversion characteristics were monitored with 1V of reverse bias applied.

As a result, the photovoltaic device with copper and zinc oxide deposited on a stainless steel substrate by the sputtering method approached a shunting level of a disabled state in 5 minutes and became unusable in 40 minutes. In contrast to this, the photovoltaic device manufactured in Example 6 with first and second metal layers and other layers formed using the apparatus shown in FIG. 3 could maintain a usable shunting level during a period of 11 hours.

By employing a method according to Example 3, the operating time and liquid temperature are freely selectable as compared with the manufacturing process using a roll-type substrate and control of current becomes possible by direct control of the cathode current. In addition, since various maintenance operations and inspections can be individually effected, a manufacturing process with a high degree of freedom can be obtained.

As described heretofore, the present invention provides a method for very inexpensively and stably manufacturing a photovoltaic device with excellent initial characteristics and long-term environmental stability and reliability.

What is claimed is:

1. A method for manufacturing a photovoltaic device comprising in sequence a metal layer, a first transparent conductive layer, a semiconductor layer, and a second transparent conductive layer stacked on a substrate comprising iron, comprising the steps of:

forming said metal layer by electro-deposition of said metal layer from a solution; and forming said first transparent conductive layer by electro-deposition of said first transparent conductive layer from another solution.

2. A method for manufacturing a photovoltaic device as set forth in claim 1, wherein etching of said iron-containing substrate with an acidic solution is performed before formation of said metal layer and formation of said first transparent conductive layer on said substrate.

3. A method for manufacturing a photovoltaic device as set forth in claim 2, wherein the steps of etching said substrate with an acidic solution, forming said metal layer and forming said first transparent conductive layer are successively performed each via an intermediate step of rinsing said substrate with water.

4. A method for manufacturing a photovoltaic device as set forth in claim 2, wherein a belt-like substrate wound in the shape of a roll is used, wherein said substrate is supplied at one end, wherein the steps of etching said substrate with an acidic solution, forming said metal layer on said substrate, and forming said first transparent conductive layer are successively performed each via an intermediate step of rinsing said substrate with water, and wherein said substrate having completed said steps is wound up at the other end.

5. A method for manufacturing a photovoltaic device as set forth in claim 1, wherein said metal layer comprises copper.

6. A method for manufacturing a photovoltaic device as set forth in claim 5, wherein in the step of forming said metal layer, an aqueous solution containing copper ions, pyrophosphate ions, and nitrate ions is employed and the pH of said solution is adjusted to 8.0–9.0.

7. A method for manufacturing a photovoltaic device as set forth in claim 1, wherein said first transparent conductive layer comprises zinc oxide.

8. A method for manufacturing a photovoltaic device as set forth in claim 7, wherein in the step of forming said first transparent conductive layer, a solution containing zinc ions and nitrate ions is employed and the pH of said solution is adjusted to 4.0–6.3.

9. A method for manufacturing a photovoltaic device as set forth in claim 1, wherein said metal layer comprises copper and said first transparent conductive layer comprises zinc oxide.

10. A method for manufacturing a photovoltaic device as set forth in claim 1, wherein said first transparent conductive layer is deposited from an acidic aqueous solution.

11. A method for manufacturing a photovoltaic device as set forth in claim 1, wherein the step of forming said metal layer and the step of forming said first transparent conductive layer are successively performed via an intermediate step of rinsing said substrate with water.

12. A method for manufacturing a photovoltaic device as set forth in claim 1, wherein a belt-like substrate wound in the shape of a roll is used, wherein said substrate is unwound at one end, wherein the steps of forming said metal layer on said substrate and forming said first transparent conductive layer are successively performed via an intermediate step of rinsing said substrate with water, and wherein the substrate having completed said steps is wound up at the other end.

13. A method for manufacturing a photovoltaic device comprising in sequence a first metal layer, a second metal layer, a first transparent conductive layer, a semiconductor layers and a second transparent conductive layer stacked on a substrate comprising iron, comprising the steps of:

forming said first metal layer by electro-deposition of said first metal layer from a solution;

forming said second metal layer by electro-deposition of said second metal layer from a solution: and forming said first transparent conductive layer by electro-deposition of said first transparent conductive layer from a solution.

14. A method for manufacturing a photovoltaic device as set forth in claim 13, wherein etching of said iron-containing substrate with an acidic solution is performed before formation of said first metal layer, formation of said second metal layer and formation of said first transparent conductive layer on said substrate.

15. A method for manufacturing a photovoltaic device as set forth in claim 14, wherein the steps of etching said substrate with an acidic solution, forming said first metal layer, forming said second metal layer and forming said first transparent conductive layer are successively performed each via an intermediate step of rinsing said substrate with water.

16. A method for manufacturing a photovoltaic device as set forth in claim 14, wherein a belt-like substrate wound in the shape of a roll is used, wherein said substrate is unwound at one end, wherein the steps of etching said substrate with an acidic solution, forming said first metal layer on said substrate, forming said second metal layer, and forming said first transparent conductive layer are successively performed each via an intermediate step of rinsing said substrate with water and wherein said substrate having completed said steps is wound up at the other end.

17. A method for manufacturing a photovoltaic device as set forth in claim 13, wherein said first metal layer comprises zinc.

18. A method for manufacturing a photovoltaic device as set forth in claim 17, wherein in the step of forming said first metal layer, an aqueous solution containing sulfate ions and zinc ions is employed and the pH of said solution is adjusted to 1.5–4.5.

19. A method for manufacturing a photovoltaic device as set forth in claim 17, wherein in the step of forming said first metal layer, an aqueous solution containing chlorine ions and zinc ions is employed and the pH of said solution is adjusted to 4.0–7.0.

20. A method for manufacturing a photovoltaic device as set forth in claim 13, wherein said second metal layer comprises copper.

21. A method for manufacturing a photovoltaic device as set forth in claim 16, wherein in the step of forming said second metal layer, an aqueous solution containing sulfate ions and copper ions is employed.

22. A method for manufacturing a photovoltaic device as set forth in claim 13, wherein said first transparent conductive layer comprises zinc oxide.

23. A method for manufacturing a photovoltaic device as set forth in claim 22, wherein in the step of forming said first transparent conductive layer, the pH of an aqueous solution containing zinc ions and nitrate ions is adjusted to 4.0–6.3.

24. A method for manufacturing a photovoltaic device as set forth in claim 13, wherein said first metal layer comprises zinc, wherein said second metal layer comprises copper, and wherein said first transparent conductive layer comprises zinc oxide.

25. A method for manufacturing a photovoltaic device as set forth in claim 13, wherein said first transparent conductive layer is deposited from an acidic aqueous solution.

26. A method for manufacturing a photovoltaic device as set forth in claim 13, wherein the steps of forming said first metal layer, forming said second metal layer, and forming said first transparent conductive layer are successively performed each via an intermediate step of rinsing said substrate with water.

27. A method for manufacturing a photovoltaic device as set forth in claim 13, wherein a belt-like substrate wound in the shape of a roll is used, wherein said substrate is unwound at one end, wherein the steps of forming said first metal-layer on said substrate, forming said second metal layer, and forming said first transparent conductive layer are successively performed each via an intermediate step of rinsing said substrate, and wherein said substrate having completed said steps is wound up at the other end.

28. A photovoltaic device comprising a metal layer formed by electro-plating, a first transparent conductive layer formed by electro-plating, a semiconductor photoelectric layer, and a second transparent conductive layer, sequentially stacked on a substrate comprising iron.

29. A photovoltaic device as set forth in claim 28, wherein said metal layer comprises copper.

30. A photovoltaic device as set forth in claim 28, wherein said first transparent conductive layer comprises zinc oxide.

31. A photovoltaic device comprising a first metal layer formed by electro-plating, a second metal layer formed by electro-plating, a first transparent conductive layer formed by electro-plating, a semiconductor photoelectric layer and a second transparent conductive layer stacked in sequence on a substrate comprising iron.

32. A photovoltaic device as set forth in claim 31, wherein said first metal layer comprises zinc.

33. A photovoltaic device as set forth in claim 31, wherein said second metal layer comprises copper.

34. A photovoltaic device as set forth in claim 31, wherein said first transparent conductive layer comprises zinc oxide.

* * * * *

UNITED STATES PATENT AND TRADEMARK OFFICE
CERTIFICATE OF CORRECTION

PATENT NO.  : 5,800,632

DATED       : September 1, 19998

INVENTOR(S) : KOZO ARAO ET AL.

It is certified that error appears in the above-identified patent and that said Letters Patent is hereby corrected as shown below:

COLUMN 2

Line 51, "apparatus" should read --an apparatus--.

COLUMN 4

Line 49, "as" should read --so as--.

COLUMN 7

Line 46, "delivered" should read --is delivered--.

COLUMN 8

Line 37, "incident the" should read --incident on the--.

COLUMN 9

Line 64, "is" should read --are--.

UNITED STATES PATENT AND TRADEMARK OFFICE
CERTIFICATE OF CORRECTION

PATENT NO. : 5,800,632

DATED : September 1, 19998

INVENTOR(S) : KOZO ARAO ET AL.                              Page 2 of 4

It is certified that error appears in the above-identified patent and that said Letters Patent is hereby corrected as shown below:

COLUMN 10

Line 27, "are" should read --is--; and "thereafter"
      should be deleted.
    Line 32, "the relaxation to water acts and" should
      be deleted.

COLUMN 12

Line 13, "1)" should read --(1)--.
    Line 42, "use" should read --used--.
    Line 48, "of design" should read --from a design--.

COLUMN 13

Line 18, "teristic" should read --teristics-.
    Line 59, "is" should read --are--.

COLUMN 14

Line 22, "2," should read --2--.

UNITED STATES PATENT AND TRADEMARK OFFICE
CERTIFICATE OF CORRECTION

PATENT NO. : 5,800,632

DATED : September 1, 19998

INVENTOR(S) : KOZO ARAO ET AL.      Page 3 of 4

It is certified that error appears in the above-identified patent and that said Letters Patent is hereby corrected as shown below:

COLUMN 15

Line 46, "steel" should read --steel substrate--.
    Line 65, "substrate" should read --substrate,--.

COLUMN 16

Line 24, "acid," should read --acid),--.
    Line 30, "is" should read --was--.

COLUMN 19

Line 26, "devices" should read --device--.
    Line 54, "used" should read --was used--.

COLUMN 20

Line 47, "steel" should read --steel substrate--.

UNITED STATES PATENT AND TRADEMARK OFFICE
CERTIFICATE OF CORRECTION

PATENT NO. : 5,800,632

DATED : September 1, 19998

INVENTOR(S) : KOZO ARAO ET AL.

It is certified that error appears in the above-identified patent and that said Letters Patent is hereby corrected as shown below:

COLUMN 22

Line 11, "layers" should read --layer--.
    Line 60, "claim 16," should read --claim 20,--.

COLUMN 23

Line 20, "metal-" should read --metal--.

Signed and Sealed this

Fourteenth Day of December, 1999

Attest:

Q. TODD DICKINSON

*Attesting Officer*     *Acting Commissioner of Patents and Trademarks*